(12) United States Patent
Sun

(10) Patent No.: US 11,428,734 B2
(45) Date of Patent: Aug. 30, 2022

(54) TEST BOARD AND TEST SYSTEM INCLUDING THE SAME

(71) Applicant: SAMSUNG ELECTRONICS CO., LTD., Suwon-si (KR)

(72) Inventor: Minkyun Sun, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 160 days.

(21) Appl. No.: 16/886,950

(22) Filed: May 29, 2020

(65) Prior Publication Data

US 2021/0148964 A1    May 20, 2021

(30) Foreign Application Priority Data

Nov. 14, 2019  (KR) .................. 10-2019-0145686

(51) Int. Cl.
```
G01R 31/26       (2020.01)
G01R 31/28       (2006.01)
G01R 31/30       (2006.01)
G01R 31/317      (2006.01)
G01R 1/067       (2006.01)
G01R 1/073       (2006.01)
G01R 19/00       (2006.01)
```
(52) U.S. Cl.
CPC ....... *G01R 31/287* (2013.01); *G01R 31/2834* (2013.01); *G01R 31/2863* (2013.01); *G01R 31/2887* (2013.01)

(58) Field of Classification Search
CPC ........ G01R 31/02; G01R 31/26; G01R 31/28; G01R 31/287; G01R 31/2863; G01R 31/30; G01R 31/31; G01R 31/317; G01R 31/319; G01R 1/067; G01R 1/073; G01R 19/00

See application file for complete search history.

(56) References Cited

U.S. PATENT DOCUMENTS

| | | | |
|---|---|---|---|
| 6,883,128 B2 | 4/2005 | Kang et al. |
| 7,151,388 B2 | 12/2006 | Gopal et al. |
| 7,652,497 B2 | 1/2010 | Kim et al. |
| 7,688,099 B2 | 3/2010 | Kim et al. |
| 8,170,828 B2 | 5/2012 | McNamara et al. |
| 8,174,278 B2 | 5/2012 | Lee et al. |

(Continued)

FOREIGN PATENT DOCUMENTS

KR    10-2007-0099770    10/2007

*Primary Examiner* — Neel D Shah
(74) *Attorney, Agent, or Firm* — F. Chau & Associates, LLC

(57) ABSTRACT

A test board includes a first board and a second board. The first board includes a socket on which a device under test (DUT) is mounted, and a first functional circuit. The first functional circuit exchanges signals and data with the DUT in an actual operating environment of the DUT, and performs a first test on the DUT using a first test signal. The first test signal is identical to a signal to be transmitted in the actual operating environment. The second board includes a processor and a multiplexer. The processor performs a second test different from the first test on the DUT using a second test signal. The second test signal is different from the first test signal and checks an electrical characteristic of the DUT itself. The multiplexer selects one of the first test signal and the second test signal to transmit to the DUT.

19 Claims, 11 Drawing Sheets

(56) References Cited

U.S. PATENT DOCUMENTS

| | | | |
|---|---|---|---|
| 8,718,967 B2 | 5/2014 | Filler et al. | |
| 9,152,520 B2* | 10/2015 | Gahoi | G06F 11/27 |
| 2014/0253099 A1* | 9/2014 | Han | G11C 29/56016 |
| | | | 324/126 |
| 2020/0393509 A1* | 12/2020 | Kim | G01R 31/31924 |

* cited by examiner

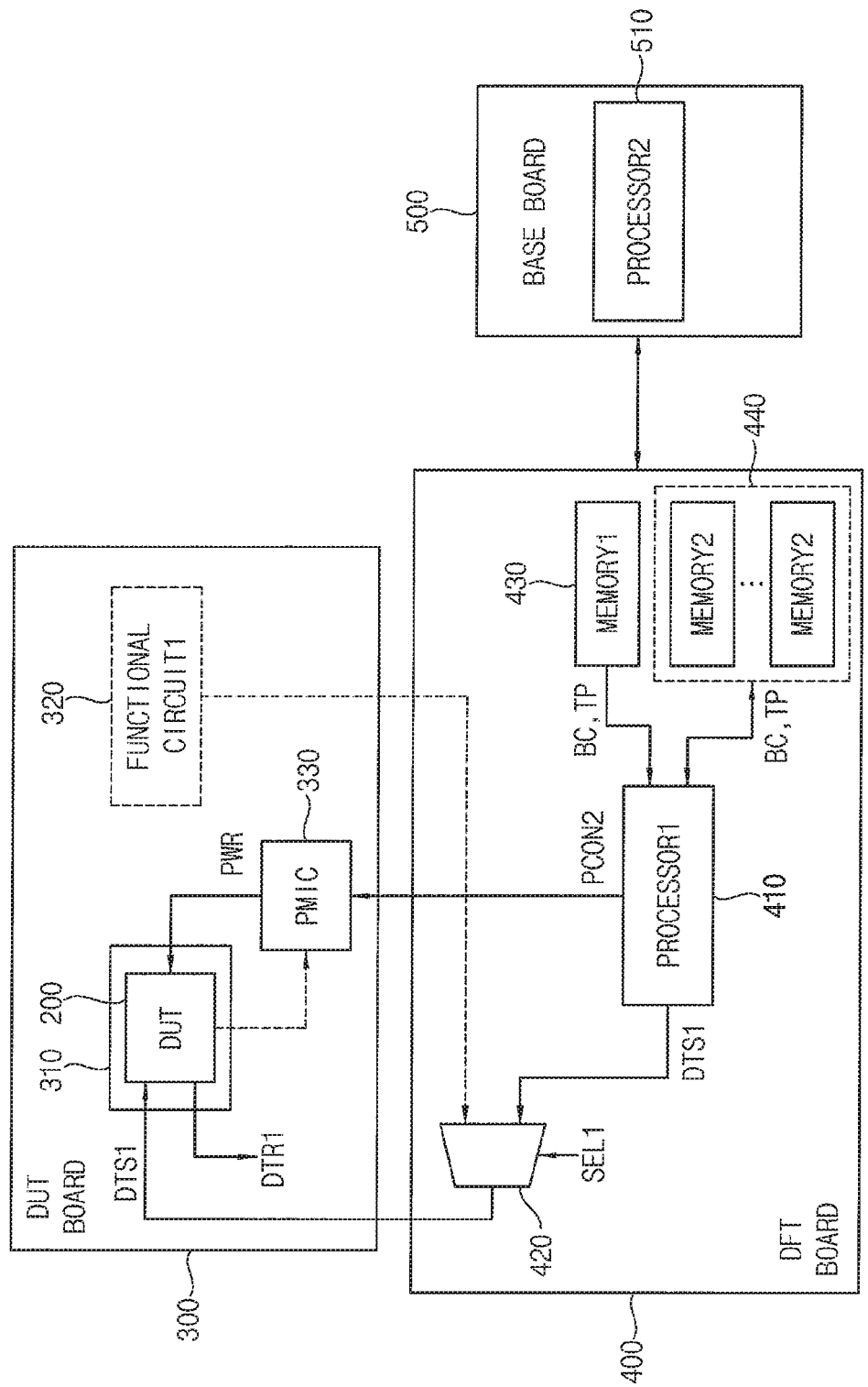

TEST BOARD AND TEST SYSTEM INCLUDING THE SAME

CROSS-REFERENCE TO RELATED APPLICATION

This application claims priority under 35 U.S.C. § 119 to Korean Patent Application No. 10-2019-0145686, filed on Nov. 14, 2019 in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly, to test boards for testing semiconductor integrated circuits and test systems including the test boards.

DISCUSSION OF RELATED ART

Presently, most semiconductor integrated circuits are tested by an automatic test equipment (ATE) for increasing yield of the semiconductor integrated circuits. However, the ATE may only measure the electric characteristics of the semiconductor integrated circuits, and thus a mounting test may also be performed on set application circuits that have the same configuration as an environment where the semiconductor integrated circuits are actually used. Conventionally, test items of an ATE test using the ATE and test items of the mounting test using the set application circuit are clearly distinguished, and compatibility or exchange of the test items may be difficult.

SUMMARY

According to an exemplary embodiment of the inventive concept, a test board includes a first board and a second board. The first board includes a socket on which a device under test (DUT) is mounted, and a first functional circuit. The first functional circuit exchanges signals and data with the DUT in an actual operating environment of the DUT, and performs a first test on the DUT by providing a first test signal to the DUT. The first test signal is identical to a first signal to be transmitted in the actual operating environment of the DUT. The second board includes a first processor and a first multiplexer. The first processor performs a second test on the DUT by providing a second test signal to the DUT. The second test is different from the first test. The second test signal is different from the first test signal and is a signal to check an electrical characteristic of the DUT itself. The first multiplexer selects one of the first test signal and the second test signal to transmit a selected one of the first and second test signals to the DUT.

According to an exemplary embodiment of the inventive concept, a test system includes a plurality of automatic test equipment (ATEs) and a plurality of test boards. The plurality of ATEs check a first electrical characteristic of a plurality of device under tests (DUTs) themselves. The plurality of test boards perform a first test and a second test on first DUTs of which the first electrical characteristic is normal among the plurality of DUTs. The first test is a test to check whether the first DUTs normally operate in an actual operating environment of the first DUTs. The second test is different from the first test and is a test to check a second electrical characteristic of the first DUTs themselves. The second electrical characteristic is different from the first electrical characteristic. Each of the plurality of test boards includes a first board and a second board. The first board includes a socket on which a corresponding DUT of the first DUTs is mounted, and a first functional circuit. The first functional circuit exchanges signals and data with the corresponding DUT in the actual operating environment of the corresponding DUT, and performs the first test on the corresponding DUT by providing a first test signal to the corresponding DUT. The first test signal is identical to a first signal to be transmitted in the actual operating environment of the corresponding DUT. The second board includes a first processor and a first multiplexer. The first processor performs the second test on the corresponding DUT by providing a second test signal to the corresponding DUT. The second test signal is different from the first test signal and is a signal to check the second electrical characteristic of the corresponding DUT itself. The first multiplexer selects one of the first test signal and the second test signal to transmit a selected one of the first and second test signals to the corresponding DUT.

According to an exemplary embodiment of the inventive concept, a test board includes a first board, a second board, and a third board. The first board performs a mounting test to check whether a device under test (DUT) normally operates in an actual operating environment of the DUT. The second board performs a design for test (DFT) test to check an electrical characteristic of the DUT itself and determines whether the DUT is defective by checking a scan output signal generated by the DUT in response to a scan input signal including a plurality of scan bits. The third board controls operations of the first board and the second board. The first board includes a socket on which the DUT is mounted, a first functional circuit, and a power management integrated circuit (PMIC). The first functional circuit exchanges signals and data with the DUT in the actual operating environment of the DUT, and performs the mounting test on the DUT by providing a first test signal to the DUT. The first test signal is identical to a first signal to be transmitted in the actual operating environment of the DUT. The PMIC controls a power supplied to the DUT, and is controlled by the DUT when the mounting test is performed on the DUT. The second board includes a first processor, a first multiplexer, a first memory, and a second memory. The first processor performs the DFT test on the DUT by providing a second test signal to the DUT. The second test signal is different from the first test signal and corresponds to the scan input signal. The PMIC is controlled by the first processor when the DFT test is performed on the DUT. The first multiplexer selects one of the first test signal and the second test signal to transmit a selected one of the first and second test signals to the DUT. The first memory stores a boot code for booting the first processor and a test pattern for generating the second test signal. The second memory loads the boot code and the test pattern from the first memory to store a loaded boot code and a loaded test pattern. The third board includes a second processor. The second processor controls operations of the first board and the second board.

BRIEF DESCRIPTION OF THE DRAWINGS

The above and other features of the inventive concept will be more clearly understood by describing in detail exemplary embodiments thereof with reference to the accompanying drawings.

FIGS. 4A and 4B are diagrams for describing an operation of the test board of FIG. 1 according to an exemplary embodiment of the inventive concept.

DETAILED DESCRIPTION OF THE EMBODIMENTS

Figure 1:
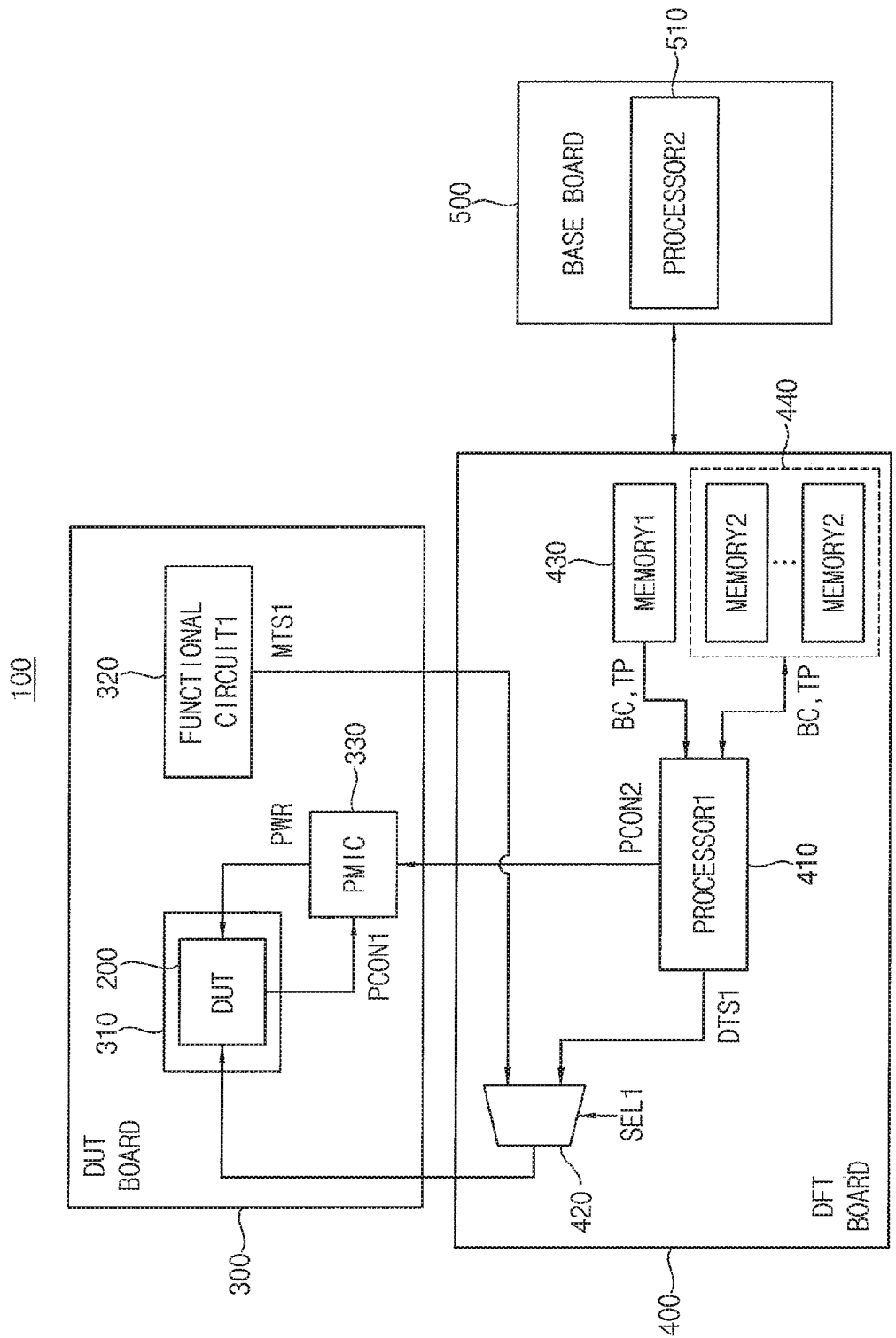
FIG. 1 is a block diagram illustrating a test board according to an exemplary embodiment of the inventive concept.

Exemplary embodiments of the inventive concept provide a test board including some test items associated with an automatic test equipment (ATE) and capable of improving or enhancing test efficiency.

Exemplary embodiments of the inventive concept also provide a test system in which some test items associated with an ATE are moved or transferred to a test board. The test system is capable of reducing the test time for ATEs, reducing the number of ATEs, and improving or enhancing test efficiency.

Exemplary embodiments of the inventive concept will be described more fully hereinafter with reference to the accompanying drawings. Like reference numerals may refer to like elements throughout this application.

FIG. 1 is a block diagram illustrating a test board according to an exemplary embodiment of the inventive concept.

Referring to FIG. 1, a test board 100 includes a first board 300 and a second board 400 that are used for testing a device under test (DUT) 200. The test board 100 may further include a third board 500 that controls operations of the first board 300 and the second board 400.

In exemplary embodiments of the inventive concept, the DUT 200 may be at least one of various integrated circuits (ICs) and/or semiconductor devices. For example, the DUT 200 may be one of a system-on-chip (SoC) or an application processor (AP). Hereinafter, exemplary embodiments will be described based on a case where the DUT 200 is an AP. However, the inventive concept is not limited thereto.

The first board 300 is a board on which the DUT 200 is mounted, has a configuration substantially the same as an actual operating environment of the DUT 200, and performs a first test on the DUT 200 in a first test mode. The first board 300 includes a socket 310 on which the DUT 200 is mounted, and a first functional circuit 320. The first board 300 may further include a power management integrated circuit (PMIC) 330. The first board 300 may be referred to as a DUT board.

The first functional circuit 320 exchanges signals and data with the DUT 200 in the actual operating environment of the DUT 200, and is used to perform the first test on the DUT 200 by providing a first test signal MTS1 to the DUT 200. The first test signal MTS1 is substantially identical to a first signal to be transmitted in the actual operating environment of the DUT 200. As will be described below, when the first test is performed in the first test mode, the first test signal MTS1 generated by the first functional circuit 320 may not be directly transmitted from the first functional circuit 320 to the DUT 200 in the first board 300, but may be transmitted from the first functional circuit 320 to the DUT 200 through a first multiplexer 420 included in the second board 400.

In exemplary embodiments of the inventive concept, the first test may be a mounting test for checking whether the DUT 200 operates normally in the actual operating environment of the DUT 200.

In exemplary embodiments of the inventive concept, in the case where the DUT 200 is the AP, the actual operating environment of the DUT 200 implemented or formed by the first board 300 may be an operating environment of at least one of various mobile systems including the AP, such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

In exemplary embodiments of the inventive concept, in the case where the actual operating environment of the DUT 200 is the operating environment of the various mobile system, the first functional circuit 320 may be at least one of the various communication devices, input/output (I/O) devices, memory devices, storage devices, or the like included in the various mobile systems. For example, the I/O devices may include an input device such as a keyboard, a keypad, a mouse, a touchpad, a touch-screen, a remote controller, etc., and an output device such as a printer, a speaker, etc. For example, the memory devices may include a volatile memory such as a dynamic random access memory (DRAM), a static random access memory (SRAM), or the like, and/or a nonvolatile memory such as a flash memory, a phase change random access memory (PRAM), a resistive random access memory (RRAM), a magnetic random access memory (MRAM), a ferroelectric random access memory (FRAM), a nano floating gate memory (NFGM), a polymer random access memory (PoRAM), or the like. For example, the storage device may include a solid state drive (SSD), a universal flash storage (UFS), a multi-media card (MMC), an embedded multimedia card (eMMC), a secure digital (SD) card, a micro SD card, a memory stick, a chip card, a universal serial bus (USB) card, a smart card, a compact flash (CF) card, or the like.

In exemplary embodiments of the inventive concept, an interface between the DUT 200 and the first functional circuit 320 may be implemented with at least one of various bus formats such as a small computer system interface (SCSI), a serial attached SCSI (SAS), a USB, a peripheral component interconnect express (PCIe), an advanced technology attachment (ATA), a parallel ATA (PATA), a serial ATA (SATA), a nonvolatile memory express (NVMe), a UFS, an eMMC, etc.

The PMIC 330 may control a power PWR supplied to the DUT 200. When the first test is performed on the DUT 200 in the first test mode, the DUT 200 may generate a first power control signal PCON1, and the PMIC 330 may be controlled by the DUT 200 based on the first power control signal PCON1.

The second board 400 is different, distinguished, distinct, and separated from the first board 300, is electrically connected to the first board 300, and performs a second test on the DUT 200 in a second test mode. The second test may be different from the first test, and the second test mode may be different from the first test mode. The second board 400 includes a first processor 410 and the first multiplexer 420. The second board 400 may further include a first memory 430 and a plurality of second memories 440.

The first processor 410 is used to perform the second test on the DUT 200 by providing a second test signal DTS1 to the DUT 200. The second test signal DTS1 is a digital signal, is different from the first test signal MTS1, and is a signal for checking an electrical characteristic of the DUT 200 itself. For example, the first processor 410 may be a field programmable gate array (FPGA) for parallel processing. However, the inventive concept is not limited thereto, and the first processor 410 may be at least one of various processors and/or controllers for parallel processing.

In exemplary embodiments of the inventive concept, the second test may be a part of an automatic test equipment (ATE) test for checking only the electrical characteristic of the DUT 200 itself. For example, the ATE test may include a direct current (DC) test for testing whether a DC parameter is suitable or appropriate for a digital operation of a circuit, and an alternating current (AC) margin test associated with or related to a transmission delay time, a set-up time, and/or a hold time of signals. Typically, the ATE test may be performed by an external ATE, and the external ATE may have various functions such as supplying a power, applying an input signal, measuring an output signal, generating a test pattern and a timing, etc. for the ATE test.

In exemplary embodiments of the inventive concept, the second test signal DTS1 may be a scan input signal including a plurality of scan bits, and the second test may be a design for test (DFT) test that is included in the ATE test and is a test for determining whether the DUT 200 is defective by checking a scan output signal generated by the DUT 200 in response to the scan input signal. The DFT test may be included in the AC margin test and may be referred to as a scan test. According to exemplary embodiments of the inventive concept, the DFT test may be performed independently of and/or individually/separately from a control of the external ATE, and may be performed by the test board 100 internally and/or by itself. The second board 400 may be referred to as a DFT board.

In addition, when the second test is performed on the DUT 200 in the second test mode, the first processor 410 may generate a second power control signal PCON2, and the PMIC 330 may be controlled by the first processor 410 based on the second power control signal PCON2.

The first multiplexer 420 selects one of the first test signal MTS1 and the second test signal DTS1 based on a first selection signal SEL1 to transmit a selected one of the first and second test signals MTS1 and DTS1 to the DUT 200. For example, when the first selection signal SEL1 has a first logic level (e.g., a logic low level), the first multiplexer 420 may transmit the first test signal MTS1 to the DUT 200. When the first selection signal SEL1 has a second logic level (e.g., a logic high level), the first multiplexer 420 may transmit the second test signal DTS1 to the DUT 200.

In other words, the first multiplexer 420 may select and enable one of a first path for performing the first test and a second path for performing the second test based on the first selection signal SEL1. In FIG. 1, an arrow for transmitting the first test signal MTS1 from the first functional circuit 320 to the first multiplexer 420 may indicate the first path, and an arrow for transmitting the second test signal DTS1 from the first processor 410 to the first multiplexer 420 may indicate the second path.

The first memory 430 may store a boot code BC for booting the first processor 410 and a test pattern TP for generating the second test signal DTS1. The plurality of second memories 440 may load the boot code BC and the test pattern TP from the first memory 430 to store a loaded boot code BC and a loaded test pattern TP. The plurality of second memories 440 may further store a test result.

In exemplary embodiments of the inventive concept, the first memory 430 may be a nonvolatile memory such as an electrically erasable programmable read-only memory (EEPROM), a flash memory, or the like, and the plurality of second memories may be a volatile memory such as a DRAM, or the like.

The third board 500 may include a second processor 510 that controls operations of the first board 300 and the second board 400. For example, the second processor 510 may generate the first selection signal SEL1, and may generate control signals for controlling other components. The third board 500 may be referred to as a base board. As will be described with reference to FIGS. 4A and 4B, the second processor 510 may enable (or activate) or disable (or deactivate) components included in the test board 100 based on the test mode. For example, the second processor 510 may be a central processing unit (CPU) for serial processing. However, the inventive concept is not limited thereto, and the second processor 510 may be at least one of various processors and/or controllers for serial processing.

Thus, as described above, the test board 100 according to exemplary embodiments of the inventive concept may include the first board 300 that performs the mounting test on the DUT 200, and the second board 400 that performs the DFT test, which is a part of the ATE test, on the DUT 200. Some test items associated with the ATE test may be moved or transferred to the test board 100 (e.g., to the second board 400 included in the test board 100). Accordingly, the test time for the external ATE may be reduced, and the number of ATEs, which are relatively expensive equipment, may be reduced without changing the testing process. Thus, the test efficiency may be improved or enhanced, and the test cost may be reduced.

Figure 2:
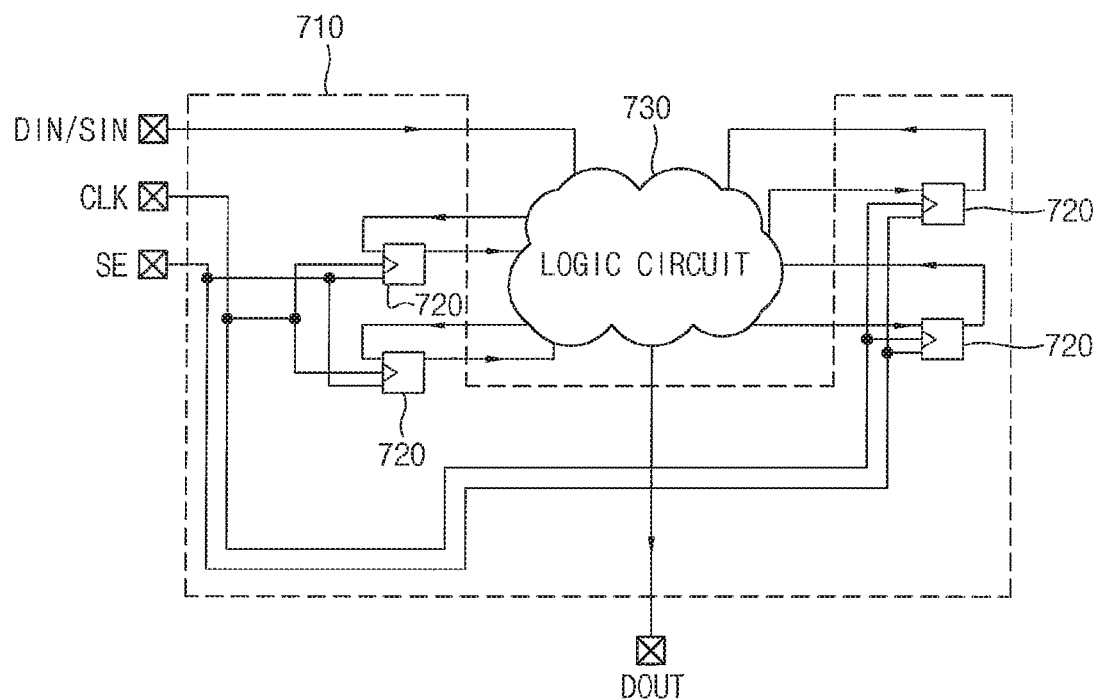
FIG. 2 is a block diagram illustrating a device under test (DUT) that is tested by a test board according to an exemplary embodiment of the inventive concept.

FIG. 2 is a block diagram illustrating a device under test (DUT) that is tested by a test board according to an exemplary embodiment of the inventive concept.

Referring to FIG. 2, a DUT that is tested by the test board according to exemplary embodiments of the inventive concept may be a data processing device 700.

In exemplary embodiments of the inventive concept, the data processing device 700 may be implemented with an IC, a SoC, or an AP. In exemplary embodiments of the inventive concept, the data processing device 700 may be implemented with at least one of various processors such as a CPU, a graphic processing unit (GPU), a neural processing unit (NPU), a digital signal processor (DSP), an image signal processor (ISP), a vision processing unit (VPU), a vision intellectual property (VIP), or the like.

The data processing device 700 may include a scan flip-flop group 710 and a logic circuit 730.

The scan flip-flop group 710 may include a plurality of scan flip-flops 720. Each of the plurality of scan flip-flops 720 may perform data communication with the logic circuit 730 based on an input clock signal CLK. The logic circuit 730 may be implemented as a synchronous circuit or an asynchronous circuit. The logic circuit 730 may process input data DIN or scan data SIN, and may provide output data DOUT corresponding to a result of the processing.

Each of the plurality of scan flip-flops 720 may select one of a data input signal and a scan input signal based on an operation mode, and may generate an output signal based on a selected one of the data input signal and the scan input signal. For example, each of the plurality of scan flip-flops 720 may generate the output signal based on the data input signal and the input clock signal CLK in a first operation mode, and may generate the output signal based on the scan input signal and the input clock signal CLK in a second operation mode.

The input data DIN, the scan data SIN, and the output data DOUT in FIG. 2 may correspond to the data input signal, the scan input signal, and the output signal, respectively. For example, the first operation mode is a normal operation mode for performing data transmission, and the second operation mode may be a scan test mode for performing a test operation. For example, the operation mode may be determined based on a logic level of a scan enable signal SE. The second operation mode and the scan input signal of each of the plurality of scan flip-flops 720 may correspond to the second test mode and the second test signal DTS1, respectively, as described with reference to FIG. 1.

Figure 3:
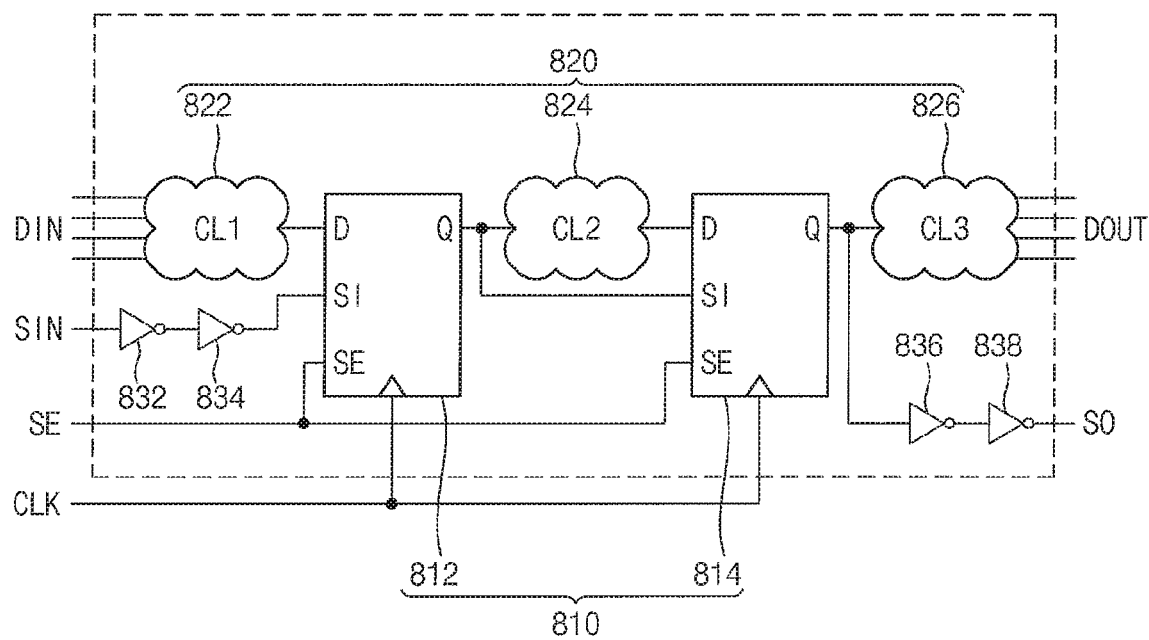
FIG. 3 is a block diagram illustrating a scan test circuit included in a DUT that is tested by a test board according to an exemplary embodiment of the inventive concept.

FIG. 3 is a block diagram illustrating a scan test circuit included in a DUT that is tested by a test board according to an exemplary embodiment of the inventive concept.

Referring to FIG. 3, a scan test circuit 800 may include a sequential circuit unit 810, a combinational circuit unit 820, and a plurality of inverters 832, 834, 836, and 838. The sequential circuit unit 810 may include a first scan flip-flop 812 and a second scan flip-flop 814, and the combinational circuit unit 820 may include a first combinational logic circuit (CL1) 822, a second combinational logic circuit (CL2) 824, and a third combinational logic (CL3) circuit 826.

The first combinational logic circuit 822 may perform an arithmetic operation on a plurality of input data DIN to provide a data input signal D to the first scan flip-flop 812. The first scan flip-flop 812 may be synchronized with the input clock signal CLK, may provide the data input signal D as output data Q in a normal operation mode (e.g., a mode where the scan enable signal SE has a logic low level), and may provide a scan input signal SI as the output data Q in a scan test mode (e.g., a mode where the scan enable signal SE has a logic high level). The scan data SIN may be provided to the first scan flip-flop 812 as the scan input signal SIN via the inverters 832 and 834. The scan input signal SI in FIG. 3 may correspond to the second test signal DTS1 described with reference to FIG. 1.

The second combinational logic circuit 824 may perform an arithmetic operation on the output data Q of the first scan flip-flop 812 to provide a data input signal D to the second scan flip-flop 814. Additionally, the second scan flip-flop 814 may receive the output data Q of the first scan flip-flop 812 as a scan input signal SI. Further, the second scan flip-flop 814 may operate in the normal operation mode or the scan test mode, based on the scan enable signal SE and the input clock signal CLK.

The third combinational logic circuit 826 may perform an arithmetic operation on the output data Q of the second scan flip-flop 814 to provide a plurality of output data DOUT. Additionally, in the scan test mode, the third combinational logic circuit 826 may provide, via the inverters 836 and 838, the output data Q of the second scan flip-flop 814 as a scan output SO. The scan output SO in FIG. 3 may correspond to a result of the second test described with reference to FIG. 1 and a second test result signal DTR1 which will be described with reference to FIG. 4B.

Figure 4A:
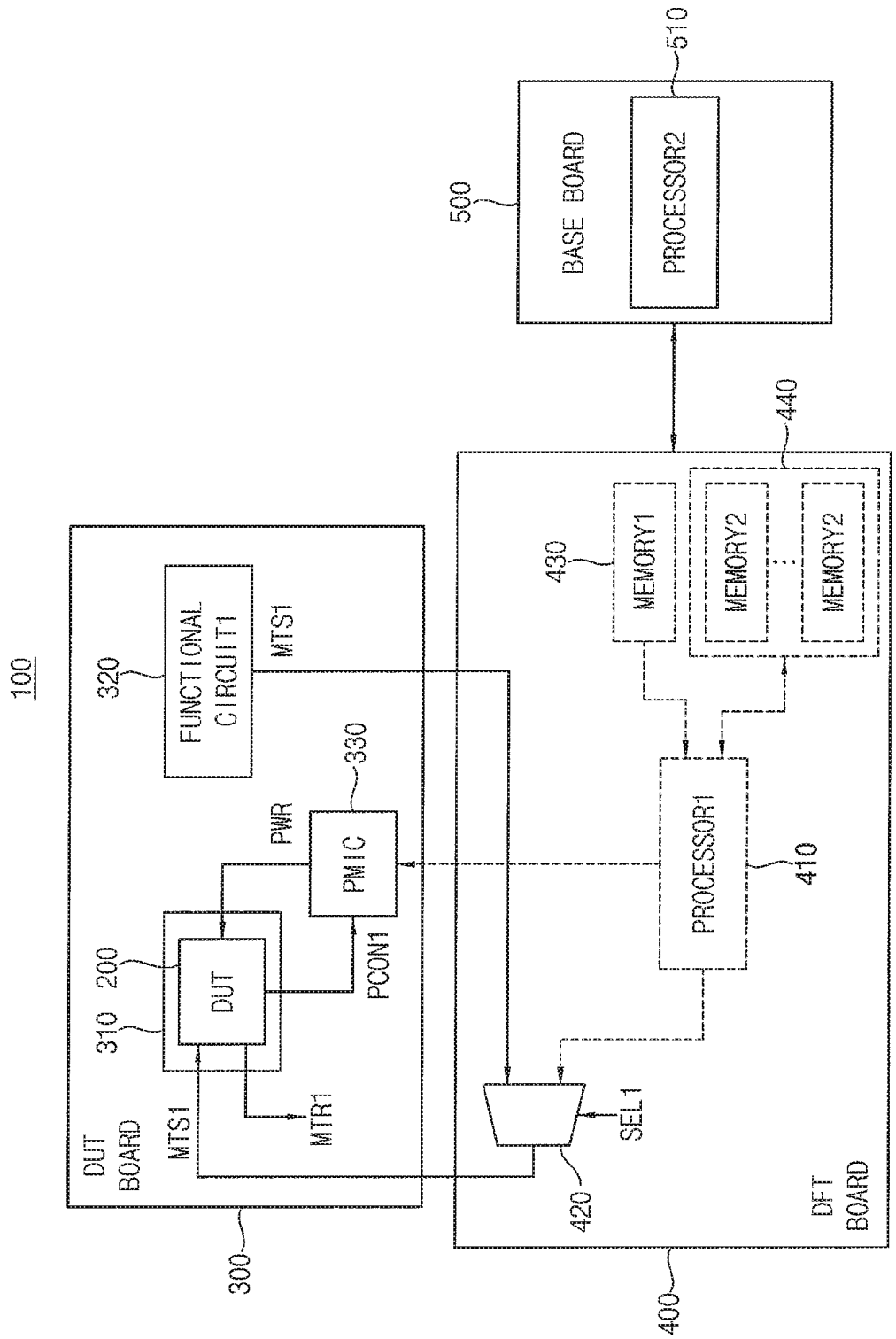

FIGS. 4A and 4B are diagrams for describing an operation of the test board of FIG. 1 according to an exemplary embodiment of the inventive concept.

Referring to FIG. 4A, when the DUT 200 is mounted on the socket 310, the third board 500 and the second processor 510 may control the first board 300 and the second board 400 in the first test mode such that the first test is performed on the DUT 200.

For example, the first functional circuit 320 may generate the first test signal MTS1, and the first multiplexer 420 may transmit the first test signal MTS1 to the DUT 200 based on the first selection signal SEL1. The DUT 200 may perform the first test based on the first test signal MTS1 to generate a first test result signal MTR1. For example, the first test result signal MTR1 may be output through a display device, a status indicator, etc., or may be stored in a memory in the first board 300, the plurality of second memories 440 in the second board 400, etc. The test board 100 may determine that the DUT 200 normally operates in the actual operating environment based on the first test result signal MTR1. The DUT 200 may generate the first power control signal PCON1, and the PMIC 330 may control the power PWR supplied to the DUT 200 based on the first power control signal PCON1.

In exemplary embodiments of the inventive concept, some of components included in the second board 400 may be disabled or deactivated in the first test mode. For example, the first processor 410, the first memory 430, the plurality of second memories 440, the second path, and a path for providing the second power control signal PCON2 may be disabled in the first test mode. In FIG. 4A, the disabled components are illustrated by dotted lines.

Referring to FIG. 4B, when the DUT 200 is mounted on the socket 310, the third board 500 and the second processor 510 may control the first board 300 and the second board 400 in the second test mode such that the second test is performed on the DUT 200.

For example, the first processor 410 may operate (e.g., boot) based on the boot code BC, and may generate the second test signal DTS1 based on the test pattern TP. The first multiplexer 420 may transmit the second test signal DTS1 to the DUT 200 based on the first selection signal SEL1. The DUT 200 may perform the second test based on the second test signal DTS1 to generate a second test result signal DTR1. As with the first test result signal MTR1, the second test result signal DTR1 may be output through the display device, the status indicator, etc., or may be stored in the memory in the first board 300, the plurality of second memories 440 in the second board 400, etc. The first processor 410 may generate the second power control signal PCON2, and the PMIC 330 may control the power PWR supplied to the DUT 200 based on the second power control signal PCON2.

In exemplary embodiments of the inventive concept, some of components included in the first board 300 may be disabled or deactivated in the second test mode. For example, the first functional circuit 320, the first path, and a path for providing the first power control signal PCON1 may be disabled in the second test mode. In FIG. 4B, the disabled components are illustrated by dotted lines.

According to exemplary embodiments of the inventive concept, an order of performing the first test and the second test may be changed. For example, the first test may be performed first and then the second test may be performed later, or the second test may be performed first and then the first test may be performed later. In exemplary embodiments of the inventive concept, when a result of a previously performed one of the first test and the second test corresponds to a failure, a subsequent one of the first test and the second test may not be performed.

FIGS. 5, 6, 7, and 8 are block diagrams illustrating a test board according to exemplary embodiments of the inventive concept. The descriptions of elements already described with reference to FIG. 1 will be omitted.

Figure 5:
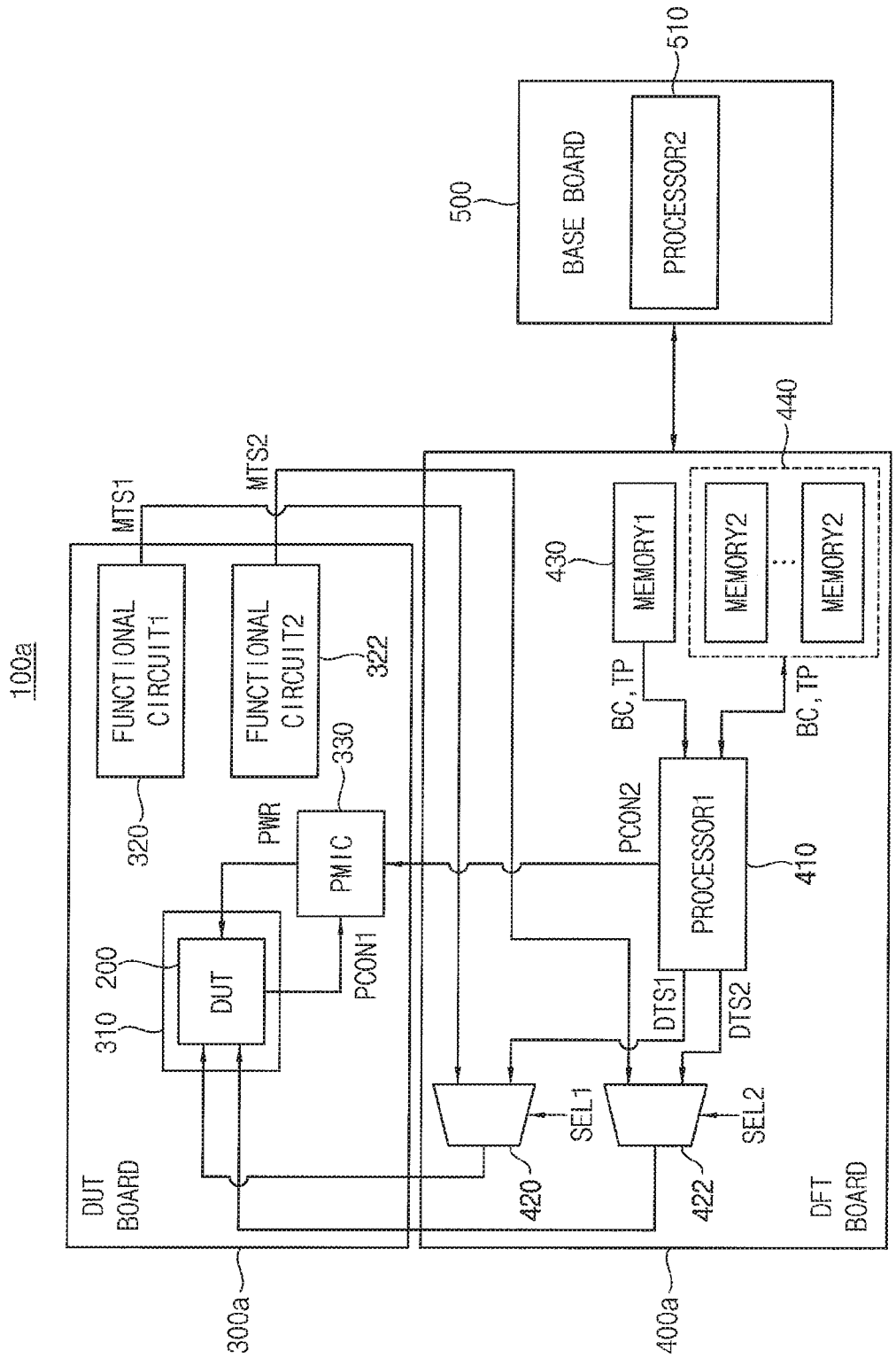
FIGS. 5, 6, 7, and 8 are block diagrams illustrating a test board according to exemplary embodiments of the inventive concept.

Referring to FIG. 5, a test board 100a includes a first board 300a and a second board 400a that are used for testing the DUT 200. The test board 100a may further include the third board 500.

The test board 100a of FIG. 5 may be substantially the same as the test board 100 of FIG. 1, except that the first board 300a includes two functional circuits 320 and 322 and the second board 400a includes two multiplexers 420 and 422.

The second functional circuit 322 may exchange signals and data with the DUT 200 in the actual operating environment of the DUT 200, and may provide a third test signal MTS2 to the DUT 200. The third test signal MTS2 may be identical to a second signal to be transmitted in the actual operating environment of the DUT 200. The third test signal MTS2 may be different from the first test signal MTS1, and the second signal may be different from the first signal. As with the first functional circuit 320 and the first test signal MTS1, the second functional circuit 322 and the third test signal MTS2 may be used to perform the first test on the DUT 200. According to exemplary embodiments of the inventive concept, the second functional circuit 322 may have a function substantially the same as or different from that of the first functional circuit 320.

The first processor 410 may further provide a fourth test signal DTS2 to the DUT 200. The fourth test signal DTS2 may be a digital signal, may be different from the second test signal DTS1 and the third test signal MTS2, and may be a signal for checking the electrical characteristic of the DUT 200 itself. As with the second test signal DTS1, the fourth test signal DTS2 may be used to perform the second test on the DUT 200.

The second multiplexer 422 may select one of the third test signal MTS2 and the fourth test signal DTS2 based on a second selection signal SEL2 to transmit a selected one of the third and fourth test signals MTS2 and DTS2 to the DUT 200. In other words, the second multiplexer 422 may select and enable one of a third path for performing the first test and a fourth path for performing the second test based on the second selection signal SEL2. In FIG. 5, an arrow for transmitting the third test signal MTS2 from the second functional circuit 322 to the second multiplexer 422 may indicate the third path, and an arrow for transmitting the fourth test signal DTS2 from the first processor 410 to the second multiplexer 422 may indicate the fourth path.

Figure 6:
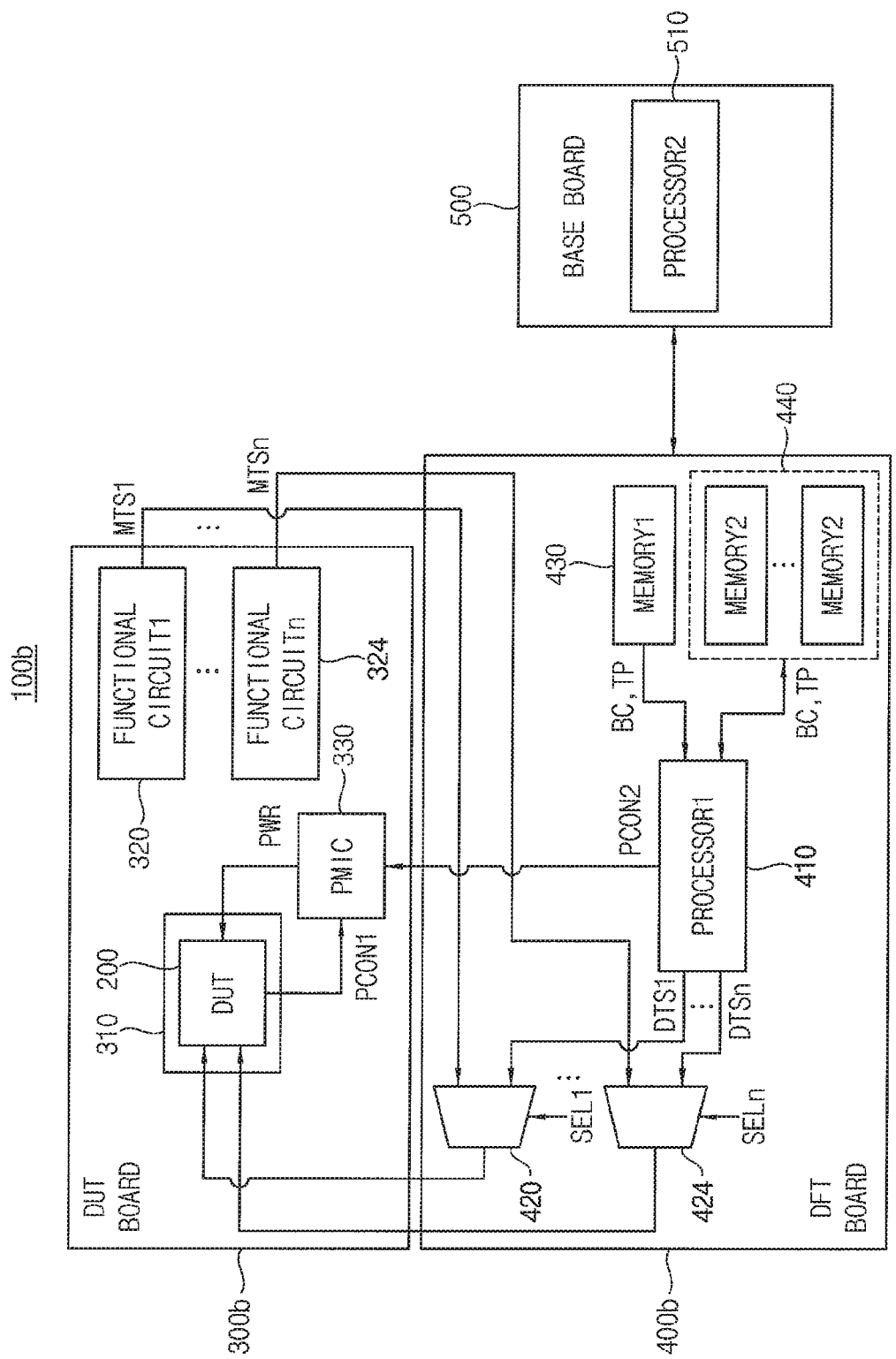

Referring to FIG. 6, a test board 100b includes a first board 300b and a second board 400b that are used for testing the DUT 200. The test board 100b may further include the third board 500.

The test board 100b of FIG. 6 may be substantially the same as the test board 100 of FIG. 1, except that the first board 300b includes n functional circuits 320 to 324 and the second board 400b includes n multiplexers 420 to 424, where n is a natural number greater than or equal to three. The n-th functional circuit 324 and the n-th multiplexer 424 in FIG. 6 may be similar to the second functional circuit 322 and the second multiplexer 422 in FIG. 5, respectively, and thus repetitive descriptions will be omitted.

The n-th functional circuit 324 may exchange signals and data with the DUT 200 in the actual operating environment of the DUT 200, and may provide a (2n−1)-th test signal MTSn to the DUT 200. The (2n−1)-th test signal MTSn may be identical to an n-th signal to be transmitted in the actual operating environment of the DUT 200. The first processor 410 may further provide a 2n-th test signal DTSn to the DUT 200. The 2n-th test signal DTSn may be a digital signal, and may be a signal for checking the electrical characteristic of the DUT 200 itself. The n-th multiplexer 424 may select one of the (2n−1)-th test signal MTSn and the 2n-th test signal DTSn based on an n-th selection signal SELn to transmit a selected one of the (2n−1)-th and 2n-th test signals MTSn and DTSn to the DUT 200.

The exemplary embodiments of FIGS. 5 and 6 may be applied to or employed in a case where the functional circuits 320, 322, and 324 operate with different interfaces (e.g., interfaces having different types).

Figure 7:
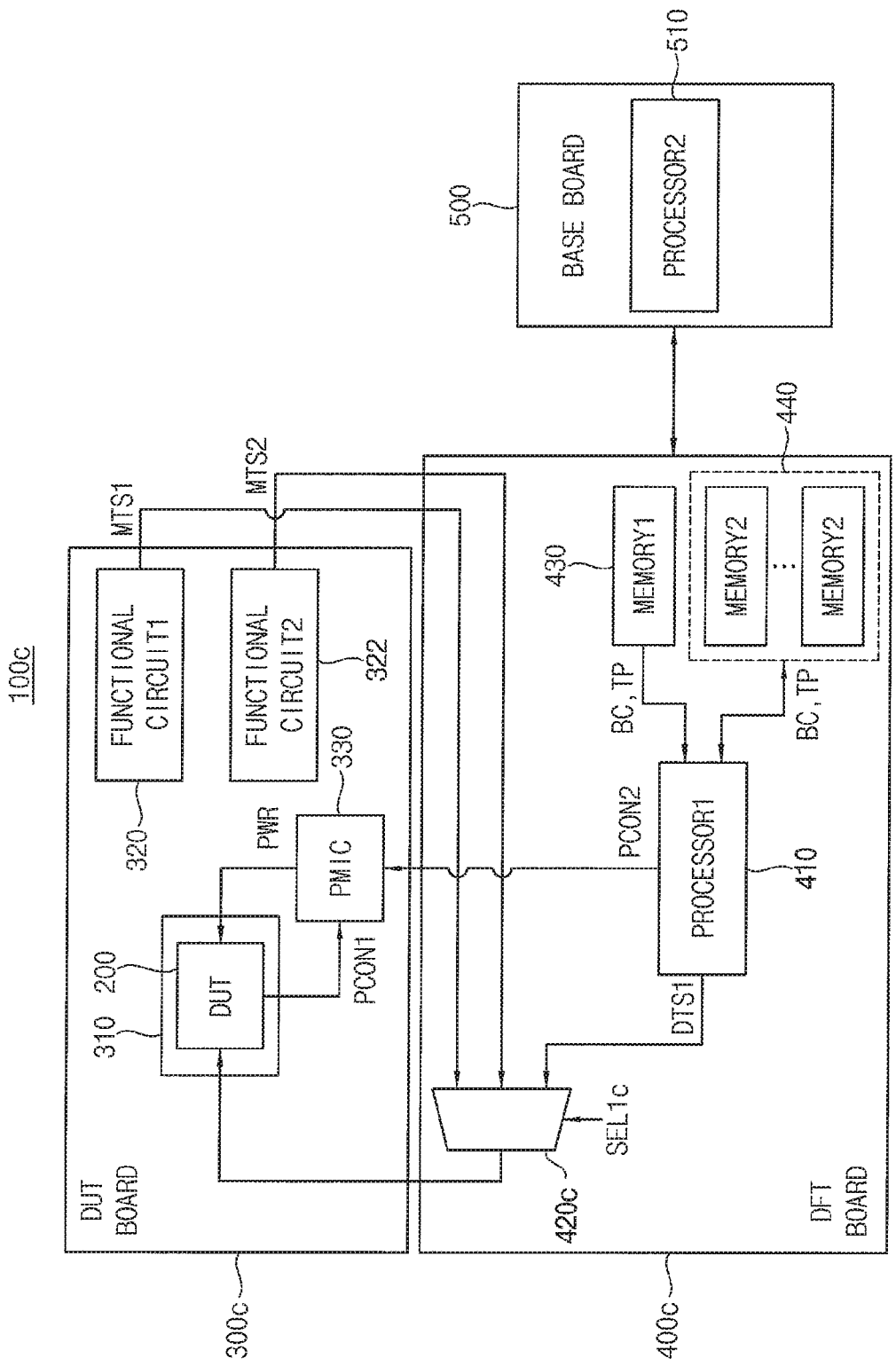

Referring to FIG. 7, a test board 100c includes a first board 300c and a second board 400c that are used for testing the DUT 200. The test board 100c may further include the third board 500.

The test board 100c of FIG. 7 may be substantially the same as the test board 100 of FIG. 1, except that the first board 300c includes two functional circuits 320 and 322 and a configuration of a first multiplexer 420c included in the second board 400c is changed. The functional circuits 320 and 322 in FIG. 7 may be substantially the same as the functional circuits 320 and 322 in FIG. 5, respectively.

The first multiplexer 420c may select one of the first test signal MTS1, the second test signal DTS1, and the third test signal MTS2 based on a first selection signal SEL1c to transmit a selected one of the first, second, and third test signals MTS1, DTS1, and MTS2 to the DUT 200. In other words, the first multiplexer 420c may select and enable one of three paths for transmitting the first test signal MTS1, the second test signal DTS1, or the third test signal MTS2 based on the first selection signal SEL1c.

Figure 8:
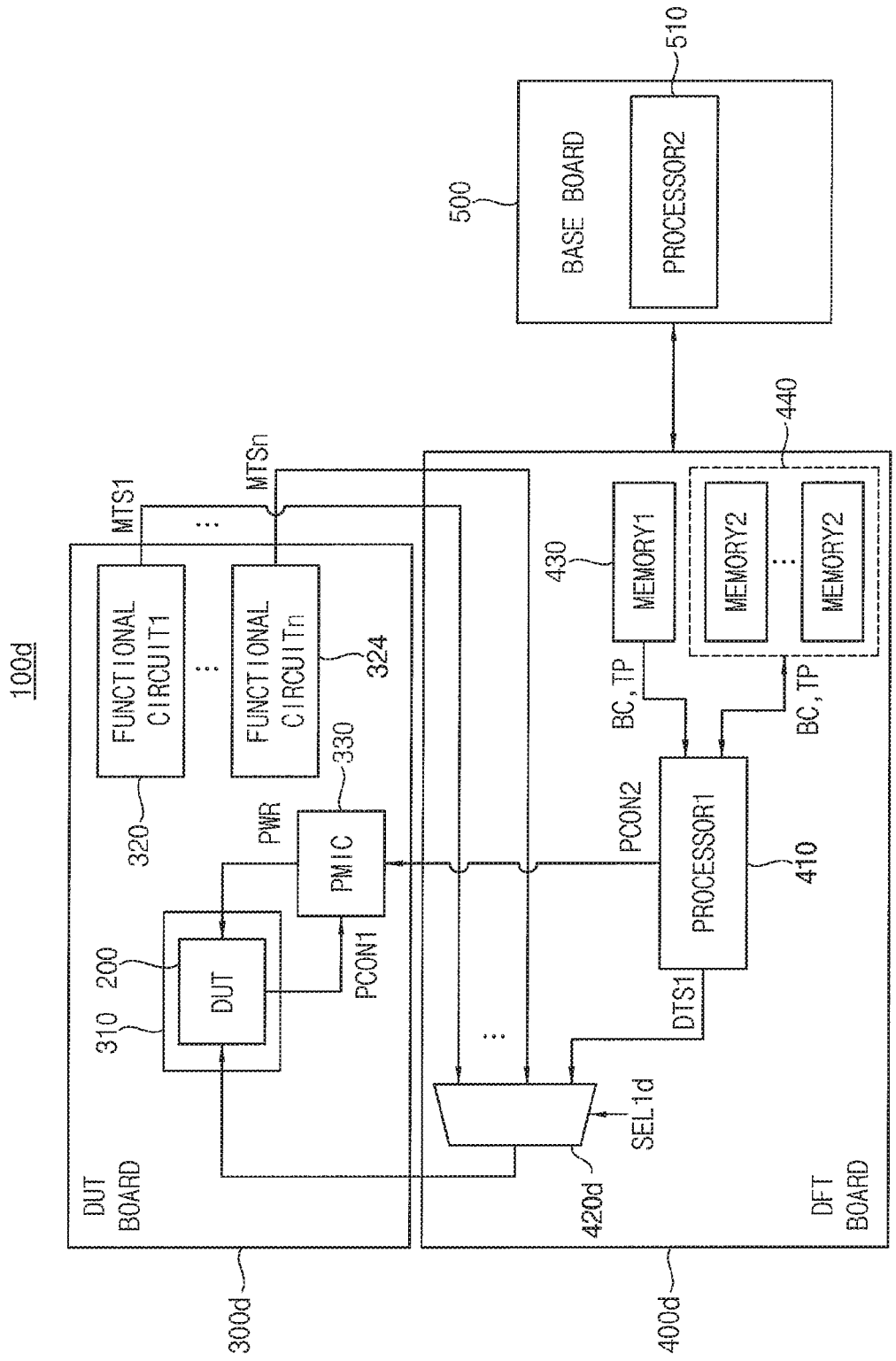

Referring to FIG. 8, a test board 100d includes a first board 300d and a second board 400d that are used for testing the DUT 200. The test board 100d may further include the third board 500.

The test board 100d of FIG. 8 may be substantially the same as the test board 100 of FIG. 1, except that the first board 300d includes n functional circuits 320 to 324 and a configuration of a first multiplexer 420d included in the second board 400d is changed. The functional circuits 320 to 324 in FIG. 8 may be substantially the same as the functional circuits 320 to 324 in FIG. 6, respectively. The first multiplexer 420d in FIG. 8 may be similar to the first multiplexer 420c in FIG. 7, and thus repetitive descriptions will be omitted.

The first multiplexer 420d may select one signal among the n test signals MTS1 to MTSn and the second test signal DTS1, based on a first selection signal SEL1d to transmit a selected test signal to the DUT 200.

The exemplary embodiments of FIGS. 7 and 8 may be applied to or employed in a case where the functional circuits 320, 322, and 324 operate with the same interface (e.g., interfaces having the same type).

Although FIGS. 5, 6, 7, and 8 illustrate examples where the first board includes a certain number of functional circuits and the second board includes a certain number of multiplexers, the inventive concept is not limited thereto.

Figure 9:
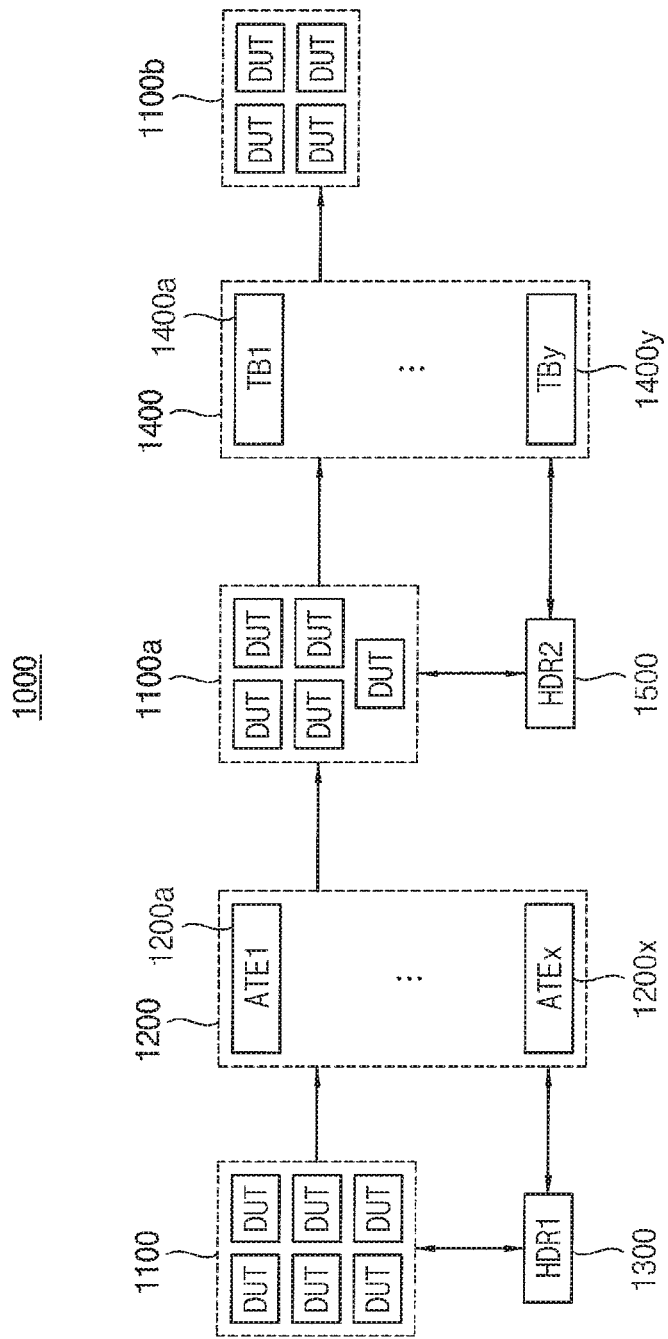
FIGS. 9 and 10 are block diagrams illustrating a test system according to exemplary embodiments of the inventive concept.
Figure 10:
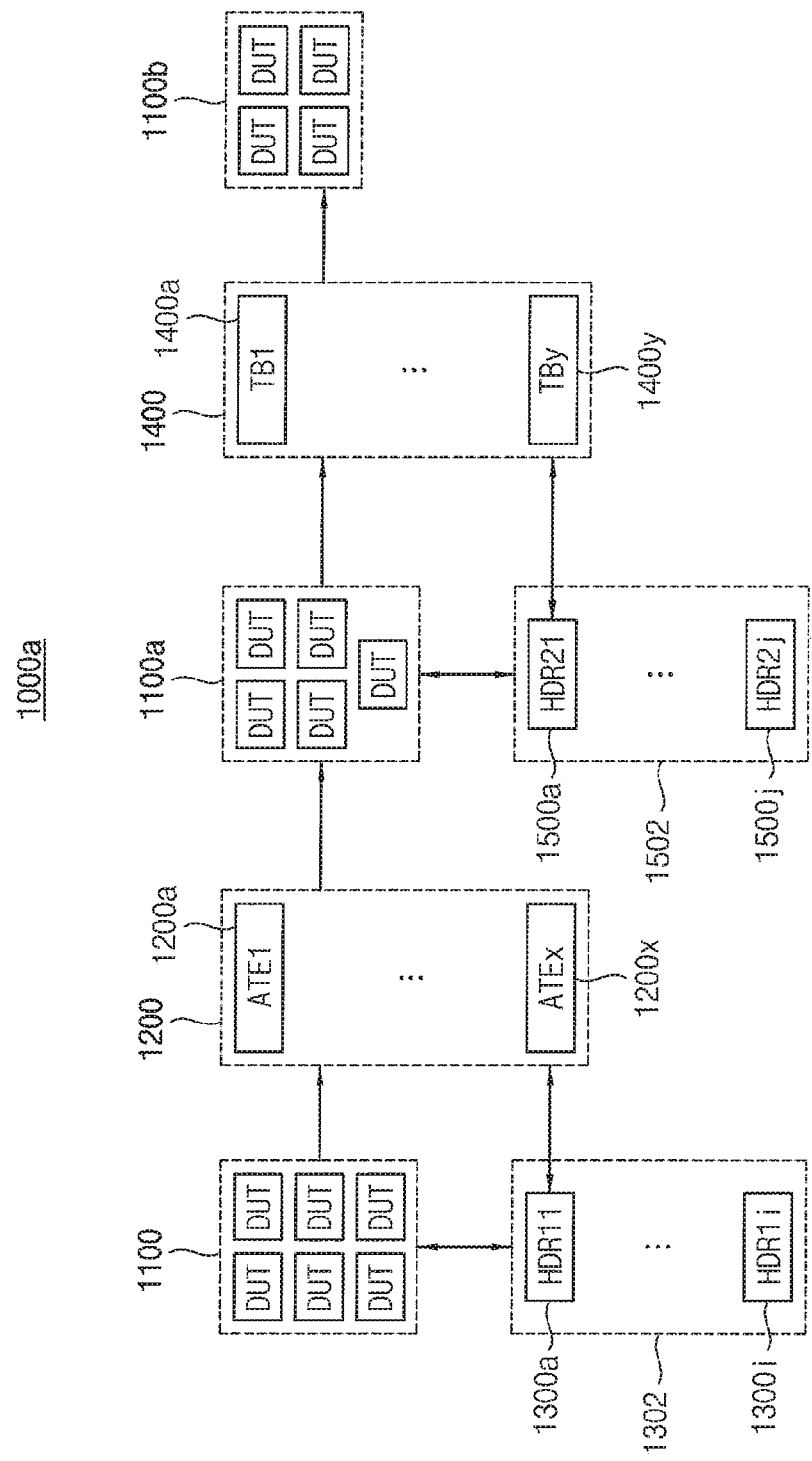

FIGS. 9 and 10 are block diagrams illustrating a test system according to exemplary embodiments of the inventive concept.

Referring to FIG. 9, a test system 1000 includes a plurality of automatic test equipment (ATEs) 1200 and a plurality of test boards 1400. The test system 1000 may further include a first handler (HDR1) 1300 and a second handler (HDR2) 1500.

The plurality of ATEs 1200 perform a test for checking a first electrical characteristic of a plurality of device under tests (DUTs) 1100 themselves. The plurality of ATEs 1200 may include a first ATE (ATE1) 1200a through an x-th ATE (ATEx) 1200x, where x is a natural number greater than or equal to two.

For example, the plurality of ATEs 1200 may test the remaining items, other than some items (e.g., the DFT test) moved or transferred to the plurality of test boards 1400, among all items of the ATE test. For example, the plurality of ATEs 1200 may perform the DC test, the AC margin test other than the DFT test, etc.

The plurality of test boards 1400 perform a first test and a second test on DUTs 1100a, of which the first electrical characteristic is normal, among the plurality of DUTs 1100. The DUTs 1100a may be referred to as first DUTs. The first test is a test for checking whether the DUTs 1100a normally operate in an actual operating environment of the DUTs 1100a. The second test is different from the first test, and is a test for checking a second electrical characteristic of the DUTs 1100a themselves. The second electrical characteristic is different from the first electrical characteristic. The plurality of test boards 1400 may include a first test board (TB1) 1400a through a y-th test board (TBy) 1400y, where y is a natural number greater than or equal to two. DUTs 1100b, which normally operate in the actual operating environment and of which the second electrical characteristic is normal among the DUTs 1100a, may be DUTs that have passed all the tests of the test system 1000. The DUTs 1100b may be referred to as second DUTs.

Each of the plurality of test boards 1400 may correspond to the test board according to exemplary embodiments of the inventive concept described with reference to FIGS. 1 through 8. For example, the first test may be the mounting test for checking whether the DUTs 1100a normally operate in the actual operating environment. The second test may be a part of the ATE test, and may be the DFT test. Each of the plurality of test boards 1400 may include the first board for performing the first test and the second board for performing the second test on a corresponding DUT of the DUTs 1100a.

In exemplary embodiments of the inventive concept, at least one of the plurality of DUTs 1100 tested by the plurality of ATEs 1200 may be determined as defective or a failure, and thus the number of the DUTs 1100a may be less than or equal to the number of the plurality of DUTs 1100. Similarly, at least one of the DUTs 1100a tested by the plurality of test boards 1400 may be determined as defective or a failure, and thus the number of the DUTs 1100b may be less than or equal to the number of the DUTs 1100a. For example, DUTs that are determined as defective or failures by the plurality of ATEs 1200 and/or the plurality of test boards 1400 may be separately collected and/or discarded.

In exemplary embodiments of the inventive concept, the number of the plurality of ATEs 1200 may be less than the number of the plurality of test boards 1400 (e.g., x<y). Typically, a plurality of DUTs are mounted on one ATE, one DUT is mounted on one test board, and one ATE is highly expensive compared to one test board. Thus, cost may be reduced and efficiency may be improved when the test system 1000 is implemented such that the number of the plurality of ATEs 1200 is less than the number of the plurality of test boards 1400. In addition, as a part of the ATE test is moved or transferred to the plurality of test boards 1400, the number of the plurality of ATEs 1200 included in the test system 1000 according to exemplary embodiments of the inventive concept may be additionally reduced compared to a conventional test system.

The first handler 1300 may transfer the plurality of DUTs 1100 to the plurality of ATEs 1200. The second handler 1500 may transfer the DUTs 1100a, of which the first electrical characteristic is normal, among the plurality of DUTs 1100 to the plurality of test boards 1400. In the example of FIG. 9, the test system 1000 may include one first handler 1300 and one second handler 1500, the first handler 1300 may be shared by the plurality of ATEs 1200, and the second handler 1500 may be shared by the plurality of test boards 1400.

In the test system 1000 according to exemplary embodiments of the inventive concept, some test items associated with the ATE test and performed by the plurality of ATEs 1200 may be moved or transferred to the plurality of test boards 1400. Accordingly, the test time for the plurality of ATEs 1200 may be reduced, the number of the plurality of ATEs 1200, which are relatively expensive equipment, may be reduced without changing the testing process. Thus, test efficiency may be improved or enhanced, and test cost may be reduced.

Referring to FIG. 10, a test system 1000a includes the plurality of ATEs 1200 and the plurality of test boards 1400. The test system 1000a may further include a plurality of first handlers 1302 and a plurality of second handlers 1502.

The test system 1000a of FIG. 10 may be substantially the same as the test system 1000 of FIG. 9, except that the test system 1000a includes the plurality of first handlers 1302 and the plurality of second handlers 1502.

The plurality of first handlers 1302 may include a first handler (HDR11) 1300a through an i-th handler (HDR1i) 1300i, where i is a natural number greater than or equal to two. For example, when the number of the plurality of first handlers 1302 is less than the number of the plurality of ATEs 1200 (e.g., i<x), one of the plurality of first handlers 1302 may be shared by at least two of the plurality of ATEs 1200. As another example, when the number of the plurality of first handlers 1302 is equal to the number of the plurality of ATEs 1200 (e.g., i=x), the plurality of first handlers 1302 may correspond one-to-one with the plurality of ATEs 1200. Alternatively, when the number of the plurality of first handlers 1302 is greater than the number of the plurality of ATEs 1200 (e.g., i>x), at least two of the plurality of first handlers 1302 may be assigned or allocated to one of the plurality of ATEs 1200.

The plurality of second handlers 1502 may include a first handler (HDR21) 1500a through a j-th handler (HDR2j) 1500j, where j is a natural number greater than or equal to two. The correspondence relationship between the plurality of second handlers 1502 and the plurality of test boards 1400 may be similar to the correspondence relationship between the plurality of first handlers 1302 and the plurality of ATEs 1200 described above. For example, when the number of the plurality of second handlers 1502 is less than the number of the plurality of test boards 1400 (e.g., j<y), one of the plurality of second handlers 1502 may be shared by at least two of the plurality of test boards 1400. As another example, when the number of the plurality of second handlers 1502 is equal to the number of the plurality of test boards 1400 (e.g., j=y), the plurality of second handlers 1502 may correspond one-to-one with the plurality of test boards 1400.

Figure 11:
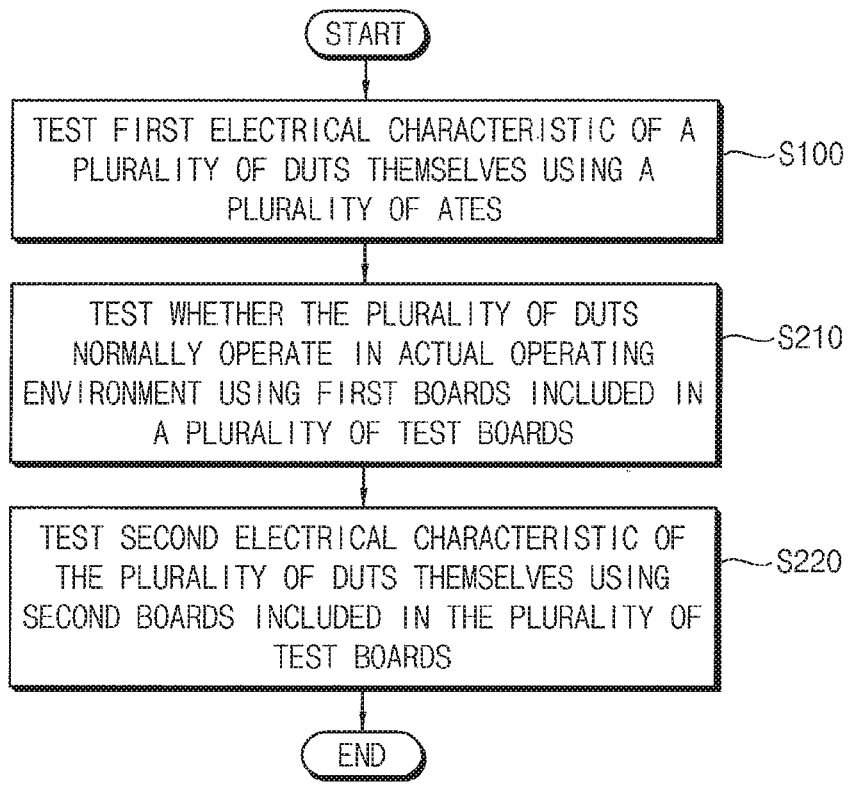
FIG. 11 is a flowchart illustrating a method of testing a DUT according to an exemplary embodiment of the inventive concept.

FIG. 11 is a flowchart illustrating a method of testing a DUT according to an exemplary embodiment of the inventive concept.

Referring to FIG. 11, in a method of testing a DUT according to exemplary embodiments of the inventive concept, a first electrical characteristic of a plurality of DUTs themselves is tested or checked using a plurality of ATEs (operation S100). For example, operation S100 may be performed by the plurality of ATEs 1200 in FIG. 9. For example, the remaining items, other than some items (e.g., the DFT test) tested in operation S220, among all items of the ATE test, may be tested in operation S100.

A first test and a second test are performed on DUTs, of which the first electrical characteristic is normal among the plurality of DUTs, using a plurality of test boards. For example, the first test for checking whether the DUTs normally operate in an actual operating environment of the DUTs is performed using first boards included in the plurality of test boards (operation S210). The second test for checking a second electrical characteristic of the DUTs themselves is performed using second boards included in the plurality of test boards (operation S220). For example, operations S210 and S220 may be performed by the plurality of test boards 1400 in FIG. 9. For example, the first test may be the mounting test, and the second test may be a part of the ATE test (e.g., the DFT test).

Although FIG. 11 illustrates that operation S210 is performed first and then operation S220 is performed later, the inventive concept is not limited thereto. For example, operation S220 may be performed first and then operation S210 may be performed later, or operations S210 and S220 may be substantially simultaneously or concurrently performed.

Figure 12:
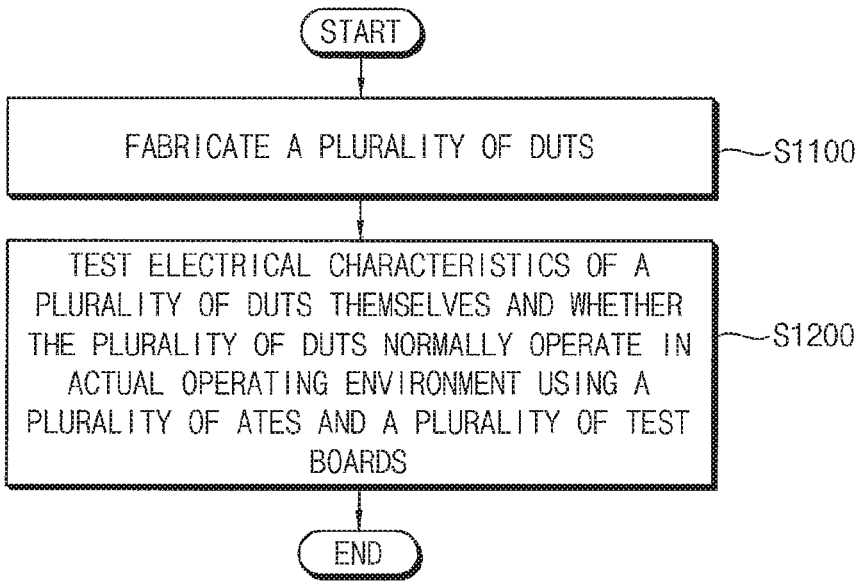
FIG. 12 is a flowchart illustrating a method of manufacturing a DUT according to an exemplary embodiment of the inventive concept.

FIG. 12 is a flowchart illustrating a method of manufacturing a DUT according to an exemplary embodiment of the inventive concept.

Referring to FIG. 12, in a method of manufacturing a DUT according to exemplary embodiments of the inventive concept, a plurality of DUTs are fabricated or manufactured (operation S1100). For example, the plurality of DUTs may be fabricated as experimental samples before beginning mass production, or may be fabricated in the mass production.

Electrical characteristics of the plurality of DUTs themselves are tested and a test for checking whether the DUTs normally operate in an actual operating environment of the DUTs is performed using a plurality of ATEs and a plurality of test boards (operation S1200). Operation S1200 may be performed by the method of testing the DUT according to exemplary embodiments of the inventive concept described with reference to FIG. 11.

In exemplary embodiments of the inventive concept, operations S1100 and S1200 may be performed on DUTs fabricated as the experimental samples, and then operations S1100 and S1200 may be performed on DUTs fabricated in the mass production.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

The inventive concept may be applied in a manufacturing process of various types of semiconductor integrated circuits and/or semiconductor devices, and more particularly, in an inspection of a mass production process to detect whether the semiconductor integrated circuits and/or the semiconductor devices have defects or not.

As described above, the test board and the test system according to exemplary embodiments of the inventive concept may include the first board that performs the mounting test on the DUT, and the second board that performs the DFT test, which is a part of the ATE test, on the DUT. Some test items associated with the ATE test may be moved or transferred to the test board. Accordingly, the test time for the external ATE may be reduced, and the number of ATEs, which are relatively expensive equipment, may be reduced without changing the testing process. Thus, the test efficiency may be improved or enhanced, and the test cost may be reduced.

While the inventive concept has been shown and described with reference to exemplary embodiments thereof, it will be understood by those of ordinary skill in the art that various modifications in form and details may be made thereto without departing from the spirit and scope of the inventive concept as set forth by the appended claims.

What is claimed is:

1. A test board comprising:
   a first board comprising:
   a socket on which a device under test (DUT) is mounted;
   a first functional circuit configured to exchange signals and data with the DUT in an actual operating environment of the DUT, and to perform a first test on the DUT by providing a first test signal to the DUT, wherein the first test signal is identical to a first signal to be transmitted in the actual operating environment of the DUT; and
   a second functional circuit configured to exchange signals and data with the DUT in the actual operating environment of the DUT, and to provide a third test signal to the DUT, wherein the third test signal is identical to a second signal to be transmitted in the actual operating environment of the DUT; and
   a second board comprising:
   a first processor configured to perform a second test on the DUT by providing a second test signal to the DUT, wherein the second test is different from the first test, the second test signal is different from the first test signal and is a signal to check an electrical characteristic of the DUT itself; and
   a first multiplexer configured to select one of the first test signal and the second test signal to transmit a selected one of the first and second test signals to the DUT.

2. The test board of claim 1, wherein:
   the first test is a mounting test to check whether the DUT normally operates in the actual operating environment based on a test result signal generated by the DUT, and
   the second test is a part of an automatic test equipment (ATE) test to check only the electrical characteristic of the DUT itself.

3. The test board of claim 2, wherein:
   the second test signal is a scan input signal including a plurality of scan bits, and the second test is a design for test (DFT) test that is included in the ATE test and is a test to determine whether the DUT is defective by checking a scan output signal generated by the DUT in response to the scan input signal.

4. The test board of claim 3, wherein the DFT test is performed independently of a control of an external ATE.

5. The test board of claim 3, wherein the DUT includes:
at least one flip-flop configured to select one of a data input signal and the scan input signal based on an operation mode, and to generate an output signal based on a selected one of the data input signal and the scan input signal.

6. The test board of claim 3, wherein the DUT is one of a system-on-chip (SoC) or an application processor (AP).

7. The test board of claim 1, wherein:
the first multiplexer selects one of a first path and a second path,
the first path is a path for providing the first test signal from the first functional circuit to the DUT and performing the first test, and
the second path is a path for providing the second test signal from the first processor to the DUT and performing the second test.

8. The test board of claim 1, wherein the first board further includes:
a power management integrated circuit (PMIC) configured to control a power supplied to the DUT.

9. The test board of claim 8, wherein:
when the first test is performed on the DUT, the PMIC is controlled by the DUT, and
when the second test is performed on the DUT, the PMIC is controlled by the first processor.

10. The test board of claim 1, wherein the second board further includes:
a first memory configured to store a boot code for booting the first processor and a test pattern for generating the second test signal; and
a second memory configured to load the boot code and the test pattern from the first memory to store a loaded boot code and a loaded test pattern.

11. The test board of claim 10, wherein the first memory is a nonvolatile memory, and the second memory is a volatile memory.

12. The test board of claim 1, wherein:
the first processor further provides a fourth test signal to the DUT,
the fourth test signal is different from the third test signal and is a signal to check the electrical characteristic of the DUT itself, and
the second board further includes:
a second multiplexer configured to select one of the third test signal and the fourth test signal to transmit a selected one of the third and fourth test signals to the DUT.

13. The test board of claim 1, wherein the first multiplexer selects one of the first test signal, the second test signal, and the third test signal to transmit a selected one of the first, second, and third test signals to the DUT.

14. The test board of claim 1, further comprising:
a third board comprising:
a second processor configured to control operations of the first board and the second board.

15. The test board of claim 14, wherein:
the first processor is a field programmable gate array (FPGA) for parallel processing, and
the second processor is a central processing unit (CPU) for serial processing.

16. A test system comprising:
a plurality of automatic test equipment (ATEs) configured to check a first electrical characteristic of a plurality of device under tests (DUTs) themselves; and
a plurality of test boards configured to perform a first test and a second test on first DUTs of which the first electrical characteristic is normal among the plurality of DUTs, wherein the first test is a test to check whether the first DUTs normally operate in an actual operating environment of the first DUTs based on a test result signal generated by the first DUTs, the second test is different from the first test and is a test to check a second electrical characteristic of the first DUTs themselves, and the second electrical characteristic is different from the first electrical characteristic,
wherein each of the plurality of test boards includes:
a first board comprising:
a socket on which a corresponding DUT of the first DUTs is mounted; and
a first functional circuit configured to exchange signals and data with the corresponding DUT in the actual operating environment of the corresponding DUT, and to perform the first test on the corresponding DUT by providing a first test signal to the corresponding DUT, wherein the first test signal is identical to a first signal to be transmitted in the actual operating environment of the corresponding DUT; and
a second board comprising:
a first processor configured to perform the second test on the corresponding DUT by providing a second test signal to the corresponding DUT, wherein the second test signal is different from the first test signal and is a signal to check the second electrical characteristic of the corresponding DUT itself;
a first multiplexer configured to select one of the first test signal and the second test signal to transmit a selected one of the first and second test signals to the corresponding DUT;
a first memory configured to store a boot code for booting the first processor and a test pattern for generating the second test signal; and
a second memory configured to load the boot code and the test pattern from the first memory to store a loaded boot code and a loaded test pattern.

17. The test system of claim 16, wherein a number of the plurality of ATEs is less than a number of the plurality of test boards.

18. The test system of claim 16, further comprising:
at least one first handler configured to transfer the plurality of DUTs to the plurality of ATEs; and
at least one second handler configured to transfer the first DUTs to the plurality of test boards.

19. A test board comprising:
a first board configured to perform a mounting test to check whether a device under test (DUT) normally operates in an actual operating environment of the DUT based on a test result signal generated by the DUT;
a second board configured to perform a design for test (DFT) test to check an electrical characteristic of the DUT itself and determine whether the DUT is defective by checking a scan output signal generated by the DUT in response to a scan input signal including a plurality of scan bits; and a third board configured to control operations of the first board and the second board, wherein the first board includes:
- a socket on which the DUT is mounted;
- a first functional circuit configured to exchange signals and data with the DUT in the actual operating environment of the DUT, and to perform the mounting test on the DUT by providing a first test signal to the DUT, wherein the first test signal is identical to a first signal to be transmitted in the actual operating environment of the DUT; and
- a power management integrated circuit (PMIC) configured to control a power supplied to the DUT, wherein the PMIC is controlled by the DUT when the mounting test is performed on the DUT, wherein the second board includes:
- a first processor configured to perform the DFT test on the DUT by providing a second test signal to the DUT, wherein the second test signal is different from the first test signal and corresponds to the scan input signal, and the PMIC is controlled by the first processor when the DFT test is performed on the DUT;
- a first multiplexer configured to select one of the first test signal and the second test signal to transmit a selected one of the first and second test signals to the DUT;
- a first memory configured to store a boot code for booting the first processor and a test pattern for generating the second test signal; and
- a second memory configured to load the boot code and the test pattern from the first memory to store a loaded boot code and a loaded test pattern, and wherein the third board includes:
- a second processor configured to control operations of the first board and the second board.

* * * * *